(12) United States Patent
Auchinleck et al.

(10) Patent No.: US 9,312,907 B2
(45) Date of Patent: Apr. 12, 2016

(54) COMPUTER APPARATUS FOR USE BY SENIOR CITIZENS

(71) Applicant: Claris Healthcare Inc., Vancouver (CA)

(72) Inventors: Geof Auchinleck, Vancouver (CA); Paul Sharman, Vancouver (CA)

(73) Assignee: Claris Healthcare, Inc., Vancouver B.C.

( * ) Notice: Subject to any disclaimer, the term of this patent is extended or adjusted under 35 U.S.C. 154(b) by 0 days.

(21) Appl. No.: 14/649,934

(22) PCT Filed: Dec. 24, 2013

(86) PCT No.: PCT/CA2013/001089
§ 371 (c)(1),
(2) Date: Jun. 5, 2015

(87) PCT Pub. No.: WO2014/106295
PCT Pub. Date: Jul. 10, 2014

(65) Prior Publication Data
US 2015/0295616 A1    Oct. 15, 2015

Related U.S. Application Data

(60) Provisional application No. 61/748,506, filed on Jan. 3, 2013.

(51) Int. Cl.
*H04M 1/00*  (2006.01)
*H04B 1/3888*  (2015.01)
*G06F 1/16*  (2006.01)
*H05K 5/00*  (2006.01)
*H05K 5/02*  (2006.01)

(52) U.S. Cl.
CPC ............ *H04B 1/3888* (2013.01); *G06F 1/1632* (2013.01); *H05K 5/0017* (2013.01); *H05K 5/0086* (2013.01); *H05K 5/02* (2013.01)

(58) Field of Classification Search
CPC ........................... H04B 1/3888; H04M 1/0283
USPC .................................. 455/90.3, 575.1, 575.8
See application file for complete search history.

(56) References Cited

U.S. PATENT DOCUMENTS

| | | | |
|---|---|---|---|
| 2013/0105662 A1* | 5/2013 | Cote | F16M 11/041 248/689 |
| 2013/0109253 A1* | 5/2013 | Gammon | F16M 11/10 439/883 |
| 2015/0185768 A1* | 7/2015 | Voege | G06F 1/166 361/679.3 |

* cited by examiner

*Primary Examiner* — Sonny Trinh
(74) *Attorney, Agent, or Firm* — Hancock Hughey LLP

(57) ABSTRACT

An apparatus for enclosing a tablet computer and for simplifying operation of the computer by senior citizens is described. The enclosure receives and supports a conventional table computer but purposefully occludes or blocks access to selected user-activated controls on the tablet such as the on-off switch, and control zone regions of the touch screen regions of the display. The enclosure is supported in a stand and includes speakers to amplify sound played through the tablet, and rechargeable batteries.

12 Claims, 5 Drawing Sheets

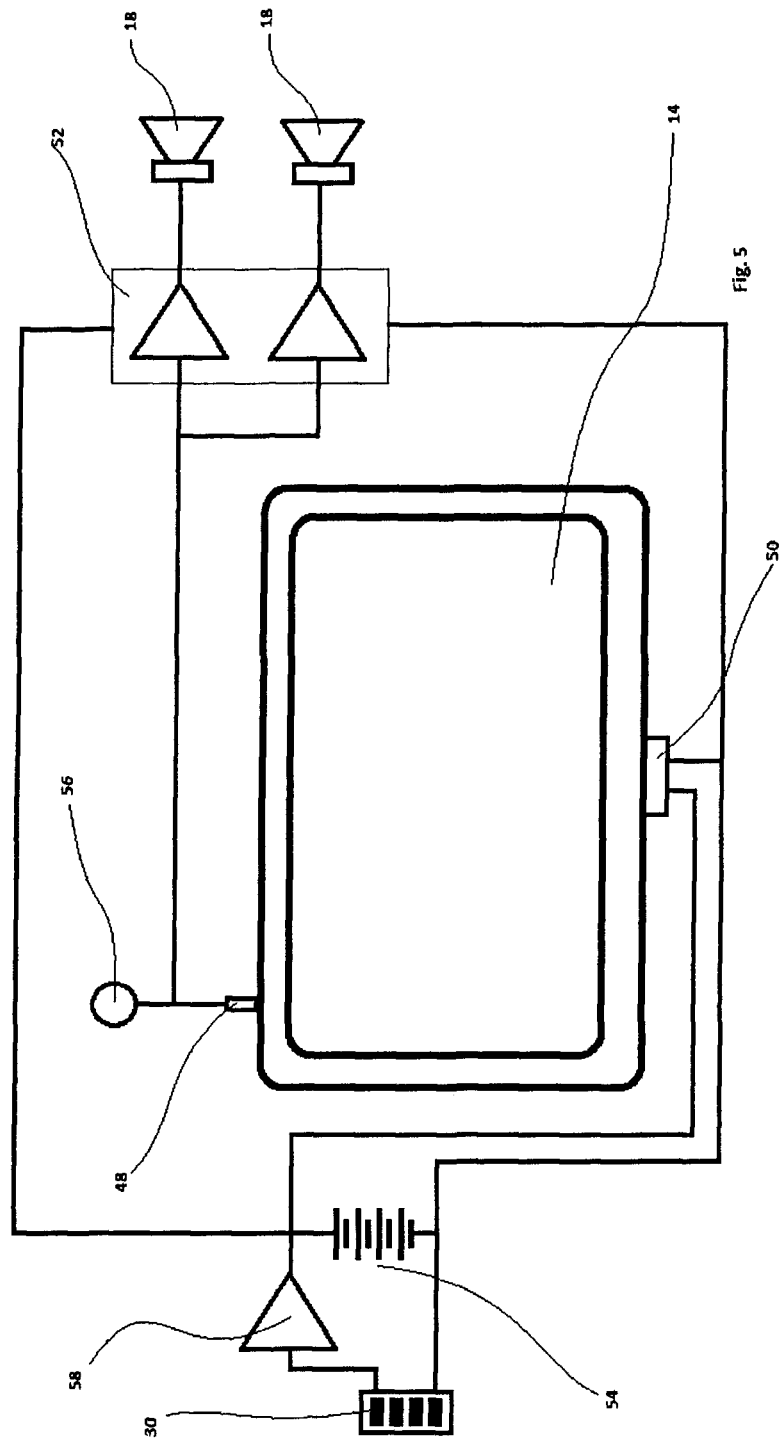

COMPUTER APPARATUS FOR USE BY SENIOR CITIZENS

FIELD OF THE INVENTION

The present invention relates generally to apparatus for enclosing and augmenting touch screen tablet computers to make them easier to use by senior citizens. The apparatus provides for amplified sound, and physical barriers to unwanted buttons or controls on the tablet computer. It further preserves mobility for the tablet computer while maintaining amplified sound, provides physical protection of the tablet computer and provides for disconnection and reconnection to a charger without the need to insert or withdraw connectors.

BACKGROUND OF THE INVENTION

Many senior citizens are reluctant to adopt Internet-based communications technologies because of the perceived technical complexity and risk of error in using such devices. Despite the relative simplicity of tablet computing devices, users are still required to have some considerable understanding of their use before they can successfully engage in email, text messaging, photo sharing or any number of other applications on these devices.

Much of this reluctance is due to the 'learning curve' that must be climbed to understand the response of tablet computers to various inputs—such as 'home' buttons, power buttons, rotation of the device and touching different regions of the touch screen. For many users, particularly for seniors, the time and effort required to understand these actions is an insurmountable barrier to their use.

Furthermore, there are many cases in which a user may need to hear sounds emanating from the tablet computer. These devices are constrained to enclose only very small loudspeakers that are able to produce a limited amount of sound, usually insufficient for a hearing-impaired senior to hear clearly.

A further challenge for users of portable tablet computers is the need to regularly connect and disconnect the device from a battery charger. This usually requires the insertion or removal of a small connector that must be precisely aligned for successful connection. Such connectors are very difficult for senior citizens to manage.

Although there are a number of display stands, protective cases and amplified speakers for tablet computers, none provide the desired mobility, ease of connection to the battery charger and the physical barrier to accidental activation of unwanted controls that are required for successful use by non-technical senior citizens.

SUMMARY OF THE INVENTION

The current invention provides an enclosure for a touch screen tablet computer such as the iPad (Apple Computer Corp), Galaxy Tab (Samsung Corporation) and many other suppliers. The enclosure provides a physical barrier that prevents users from activating the power button, volume buttons, home button or other external controls, and may extend over parts of the touch screen that are dedicated to control functions (for example the 'navigation bar' that is present on the touch screen of Android (Google Corporation) tablet computers), again to prevent unintended activation of these control functions.

In addition to the physical barrier to the controls of the tablet computer, the enclosure according to the invention provides a protective structure around the tablet computer to prevent damage in the event of accidental drops or falls.

In another aspect, the present invention incorporates an amplifier circuit and loudspeakers which are powered by batteries incorporated in the tablet computer or in the enclosure. This amplifier is connected to the tablet computer so as to amplify sounds emitted by the tablet computer, and being power by either the tablet computer batter or a battery in the enclosure, continues to operate even when the tablet computer is removed from an external power supply.

The invention further provides for a charging stand upon which the tablet computer enclosure can be placed. When placed on the stand, the batteries of both the tablet computer and the amplifier (if present) are recharged. Connection to the charger is facilitated by electrical contacts or through inductive (non-contact) means. Mechanical means are provided to ensure correct alignment between the electrical contacts or inductive coupler on the tablet computer enclosure and the electrical contacts or inductive coupler on the charging stand, such mechanical means including either interlocking mechanical features or magnets or a combination of the two.

BRIEF DESCRIPTION OF THE DRAWINGS

These and other objects, features and advantages of the present invention will become apparent upon reference to the following detailed description of the exemplary embodiment presented herein and to the drawings wherein:

FIG. 5 is a block diagram of an amplifier and battery charging circuit according to the invention.

DETAILED DESCRIPTION OF THE INVENTION

Figure 1:
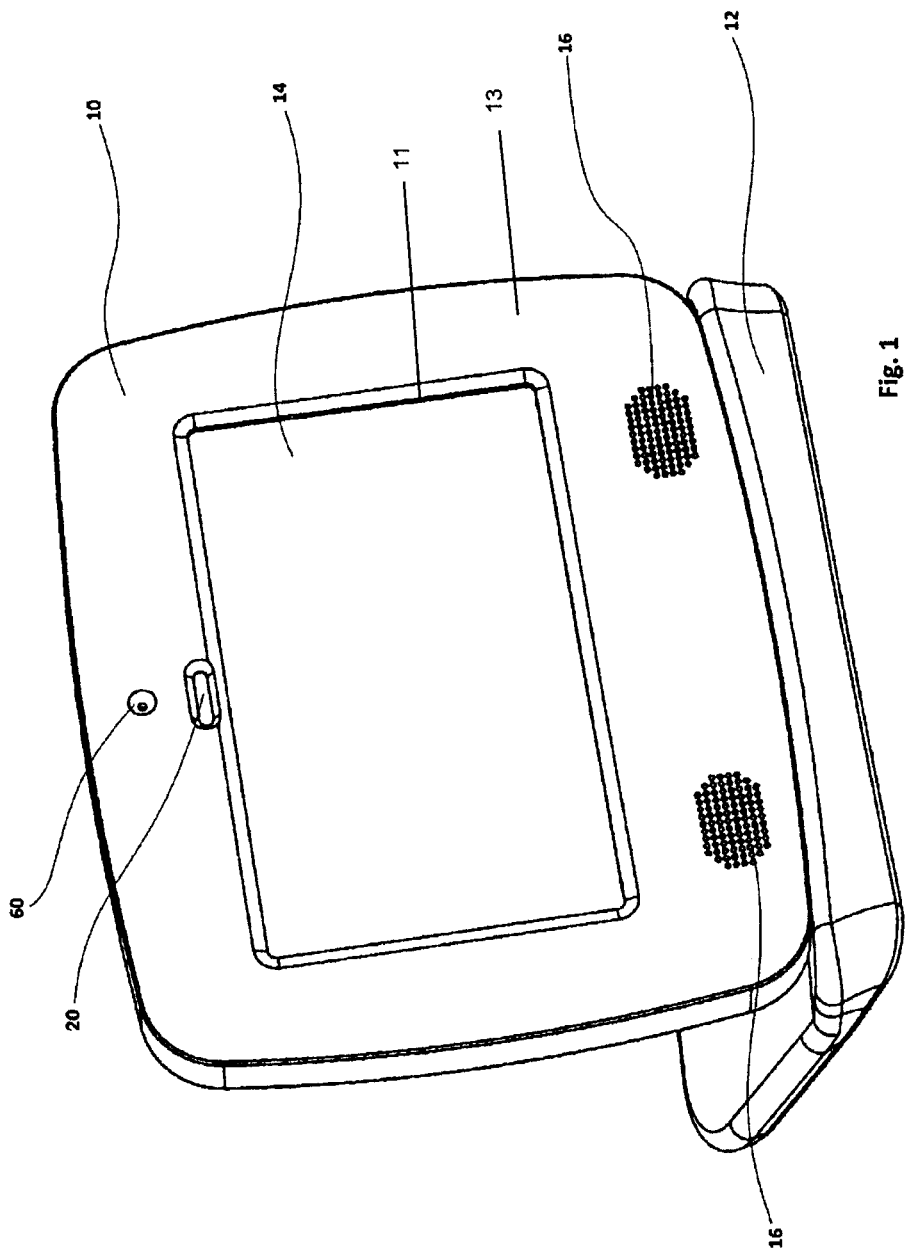
FIG. 1 illustrates a perspective view of the tablet computer enclosure and charging stand according to the invention.

FIG. 1 shows a perspective view of tablet computer enclosure 10 resting on charger stand 12. As detailed below, enclosure 10 is adapted to enclose and retain a tablet computer 14, which in the preferred embodiment is a Samsung Galaxy Tab 2 tablet computer (Samsung Corporation), but may be any similar product such as the Apple iPad (Apple Computer Corporation). In the preferred embodiment, enclosure 10 and stand 12 are made of wood, however both parts could be made of any suitable material such as plastic or metal without changing the intent of the current invention.

FIG. 1 further illustrates speaker grilles 16, behind which are located speakers 18, such that the sound produced by speakers 18 is projected through grilles 16 towards the user of the device. Enclosure 10 defines a peripheral frame 11 having a central opening 13 through which selected portions of the screen of tablet 14 are visible to the user. The size of central opening 13 is smaller than the size of the touch screen of the tablet computer. As described below, select portions of the touch screen are occluded by the peripheral frame so that the user cannot access and touch such occluded portions of the touch screen. Moreover, the enclosure intentionally occludes access to other "control surfaces" of the tablet 14 as defined below, such as, for example, the power button.

Referring to FIG. 1, opening 20 is disposed to expose the camera element incorporated in tablet computer 14. This allows the camera element in tablet computer 14 to observe the user through opening 20. Opening 60 is disposed to provide an air passage to microphone 56, located within enclosure 10 as hereinafter described.

Stand 12 includes an upright supporting plate 17 against which enclosure 10 rests when the enclosure is connected with the stand 12, and which is intended to hold enclosure 10 in an orientation that is suitable for easily viewing the screen of tablet computer 14. In the preferred embodiment, the front surface of tablet computer 14 is held at an angle of about 22 degrees from vertical so that images displayed on the front surface of tablet computer 14 are easily visible from either a sitting or standing position when stand 12 is resting on a table.

Figure 2:
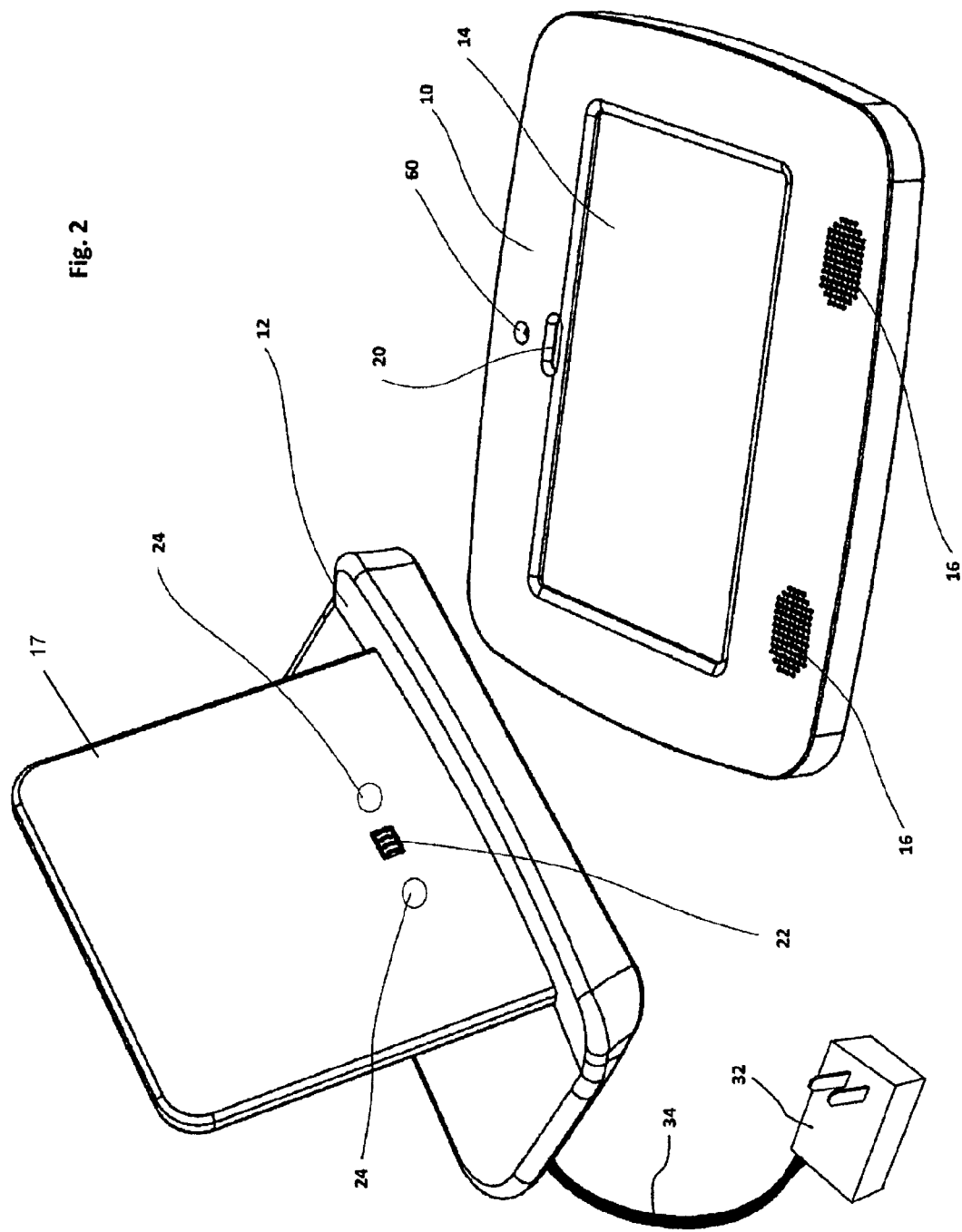
FIG. 2 illustrates the apparatus of FIG. 1 where the tablet computer enclosure is detached from the charger stand.

FIG. 2 shows the assembly of FIG. 1 wherein enclosure 10 has been removed from stand 12. Visible on upright supporting plate 17 of stand 12 are electrical spring contacts 22, which in the preferred embodiment are four-position male modular contacts (70ADH-4-ML0, Bournes Inc.). Contacts 22 are connected to power supply module 32 via cable 34.

Magnets 24 are embedded in the supporting plate 17 of stand 24 in a position that causes them to align with similar magnets on the back side of enclosure 10 as hereinafter described. Magnets 24 are oriented such that their magnetic poles will mate with the opposite poles of the corresponding magnets on the back of enclosure 10.

Figure 3:
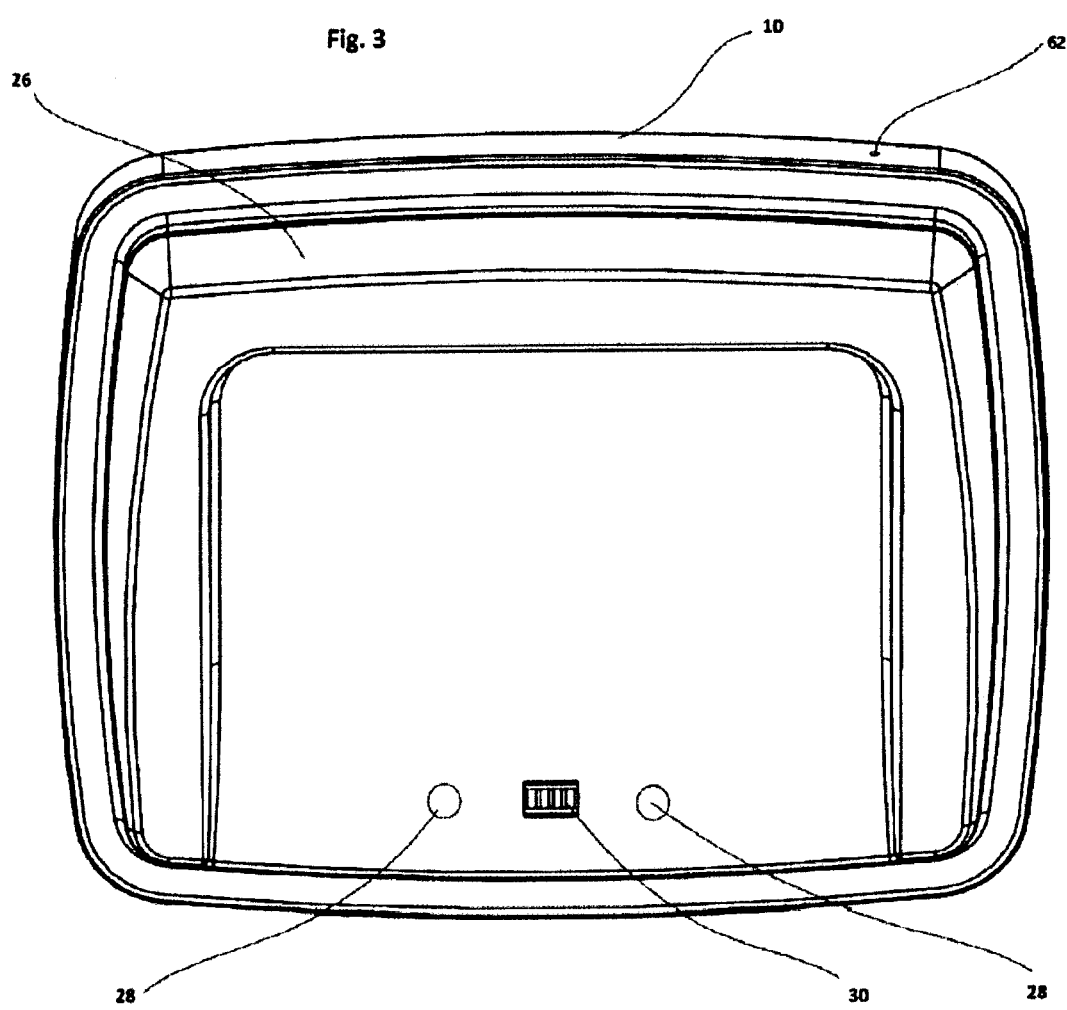
FIG. 3 is a rear view of the enclosure of FIG. 1.

FIG. 3 is a rear view of enclosure 10. In this view, it can be seen that enclosure 10 incorporates rear cover 26 which is disposed to enclose the back side of tablet computer 14 as well as the amplifier and battery charging circuitry as hereinafter described.

FIG. 3 also illustrates electrical contacts 30, which in the preferred embodiment are four-position female modular contacts (70ADH-4-FL0, Bournes Inc.), and magnets 28 which are embedded in rear cover 26.

Magnets 24 and 28 and contacts 22 and 30 are positioned on enclosure 10 and stand 12 such that when magnets 24 and magnets 28 are pulled into alignment by their mutual magnetic attraction, contacts 22 and contacts 30 are pressed into alignment and contact with each other such that a good electrical connection is created between contacts 22 and contacts 30. In this way, electrical power from power supply module 32 is delivered to the circuitry within enclosure 10 via contacts 22 and contacts 30.

Figure 4:
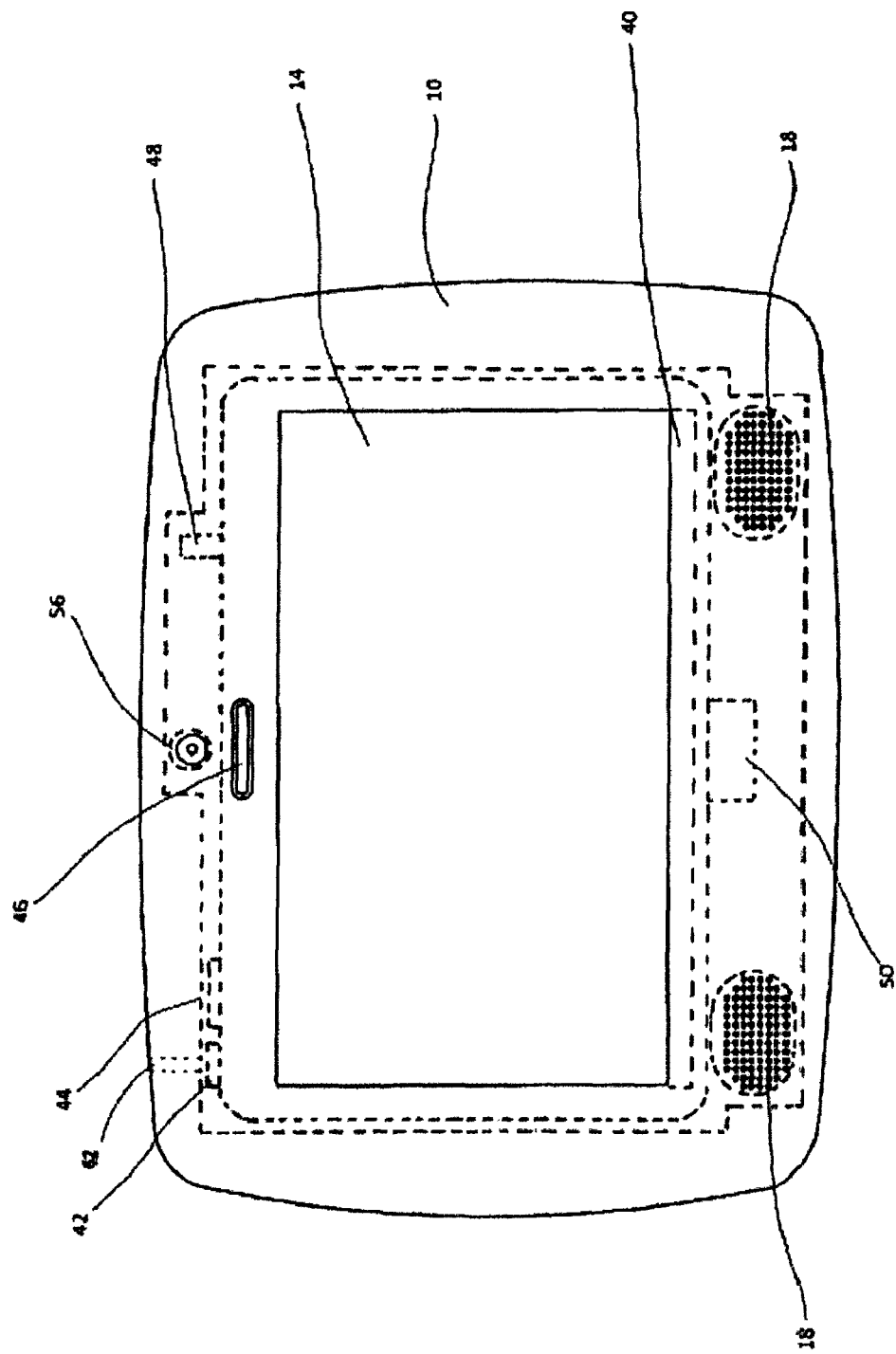
FIG. 4 is a schematic representation of the tablet enclosure of FIG. 1 showing how the tablet computer, electrical components and speakers are disposed within the enclosure.

Referring to FIG. 4, tablet computer 14 is located within the central opening 11 of peripheral frame 13 of enclosure 10 such that enclosure 10 covers region 40 of the touch screen incorporated in tablet computer 14 thereby occluding access to the covered region 40 to prevent the user from accessing any parts of the touch screen that control the operation of the table computer 14. In the preferred embodiment, tablet computer 14 runs the Android operating system (Google Inc.), in which region 40 is used to incorporate touch screen regions that when activated, trigger various administrative functions of tablet computer 14. Enclosure 10 also covers power button 42 and volume buttons 44 of tablet computer 14. Covering these elements, that is, power button 42, volume button 44, and the touch screen portions of region 40 (all of which are referred to herein as "control surfaces" is done to ensure that the user of the present invention is prevented from touching, accidentally or intentionally, any of buttons 42, 44 or touch screen regions 40 so as to inadvertently trigger administrative functions of tablet computer 14. The central opening 11 illustrated in the drawings is generally rectangular in shape. It will be appreciated that the central opening 11 may be provided in other geometric configurations so long as the function of occluding access to the control surfaces of tablet 14 is accomplished.

Opening 62 provided access to power button 42 so that it may be operated by a tool, such as a metal pin or stiff wire. To turn tablet computer 14 on or off, the user inserts the tool into opening 62 to depress power button 42. The opening 62 is too small for the user to access the power button 42 with his or her finger.

FIG. 4 also illustrates how speakers 18 are positioned behind speaker grilles 16.

Electronics package 46, shown schematically in FIG. 4 and hereinafter described, is located behind tablet computer 14, within rear cover 26. Electronics package 46 is connected to electrical contacts 30, headphone jack 48 and battery charging jack 50 of tablet computer 14.

Referring to FIG. 5, electronics package 46 comprises amplifier 52, amplifier battery 54, microphone 56 and battery charging circuit 58. Many possible configurations and circuits for amplifying signals to drive speakers and for recharging batteries are well known in the art.

In operation, audio signals generated by tablet computer 14 are delivered as a stereo signal from headphone jack 48 of tablet computer 14. These signals are directed to amplifier 52 which in turn drives speakers 18. In the preferred embodiment, headphone jack 48 of tablet computer 14 is also disposed to receive a signal from a microphone. The signal from microphone 56 is therefore also directed into headphone jack 48. As can be seen in FIG. 4, microphone 56 is positioned behind opening 60 in enclosure 10 so that sound can pass through opening 60 to reach microphone 56.

Charging circuit 58 receives power from power supply module 32 via contacts 30 as previously described. Charging circuit 58 delivers power to amplifier batteries 54 which in turn provided power to amplifier 52. Charging circuit 58 also delivers power to tablet computer 14 via charging jack 50.

In use, charging circuit 58 delivers a charging current to amplifier batteries 54, amplifier circuit 52 and tablet computer 14 whenever enclosure 10 is placed onto charger stand 12, thereby making an electrical connection between contacts 22 and contacts 30. When enclosure 10 is removed from charger stand 12, amplifier batteries 54 supply current to amplifier circuit 52 and the rechargeable batteries within tablet computer 14 supply current to tablet computer 14. In this way, both amplifier circuit 58 and tablet computer 14 continue to operate when enclosure 10 is removed from charger stand 12. This is useful for users who may wish to use tablet computer 14 while resting it in their lap or on a table.

When enclosure 10 is returned to charger stand 12, magnets 24 and 28 act to pull enclosure 10 into correct alignment with charger stand 12, ensuring proper contact between contacts 22 and contacts 30, re-establishing the electrical connection between power supply module 32 and charging circuit 58. This greatly eases the process of reliably replacing enclosure 10 onto charger stand 12 for users who may no longer have fine motor skills, such as elderly users.

Amplifier circuit 52 and speakers 18 act to greatly amplify audio signals created by software that may be running on tablet computer 14. This is useful for users who may be hard of hearing.

It will be appreciated that the foregoing disclosure in combination with the drawings describe an computer enclosure that allows a senior to view the display screen of a tablet computer, yet effectively occludes control surfaces to thereby prevent the senior from accessing that portions of the computer. The invention thus defines an apparatus and method for restricting access to defined portions of a tablet computer.

Many different adaptations and variations of the subject invention are possible without departing from the scope and spirit of the present invention, therefore, the present invention should be limited only by the scope of the appended claims.

The invention claimed is:

1. An enclosure for a tablet computer having plural user-activated control surfaces and including a touch-sensitive display screen having touch-sensitive user-activated control surfaces located therein, said enclosure comprising:
   a frame adapted for receiving and partially enclosing the tablet computer and having a central opening through which a portion of the display screen is exposed and wherein said frame occludes selected user-activated control surfaces including user-activated control surfaces located in said touch-sensitive display screen so that a user cannot activate said occluded user-activated control surfaces; and
   a charger stand having an upright support plate with at least one pair of magnets therein, and wherein the enclosure includes a rear surface that faces the support plate and the rear surface includes at least one pair of magnets positioned to mate with the at least one pair of magnets in the upright support plate.

2. The enclosure according to claim 1 wherein one of the selected user-activated control surfaces occluded by the frame is the power on-off button of said computer.

3. The enclosure according to claim 2 wherein the frame further includes an opening operably positioned relative to the power on-off button that allows a tool to be inserted into the opening to activate the power on-off button, but preventing a user from activating the power on-off button with a finger.

4. The enclosure according to claim 3 in which the touch-sensitive display screen includes on-screen menu buttons and the selected user-activated control surfaces that are occluded by said frame includes some or all of said on-screen menu buttons displayed on the display screen.

5. The enclosure according to claim 3 wherein said frame further includes an opening so that a camera in the tablet computer is not occluded by the frame.

6. The enclosure according to claim 1 further including first electrical contacts located on the surface of the upright support plate and second electrical contacts located on the rear surface of the enclosure such that when the magnets in the support plate and the magnets in the enclosure mate, they cause the first and second electrical contacts to become aligned and to facilitate electrical contact therebetween.

7. A method of controlling the operation of a tablet computer that has plural user-activated control surfaces located on a touch-sensitive display screen, comprising the steps of:
   a. installing the tablet computer in a frame adapted for receiving and partially enclosing said tablet computer and such that a desired portion of said display screen is visible through a central opening in said frame and such that said frame physically occludes selected user-activated control surfaces including a selected portion of said touch-sensitive display screen to prevent operation of said selected user-activated control surfaces by a user's finger, and wherein said frame includes a rear surface with a pair of magnets and electrical contacts connected to a battery for said tablet computer;
   b. providing a stand having an upright support plate with a pair of magnets and electrical contacts connected to a power supply; and
   c. positioning the frame on the support stand so the such that the pair of magnets on the rear surface of the frame mate with the pair of magnets in the upright support plate and the electrical contacts on the frame make electrical contact with the electrical contacts on the upright support plate to thereby charge the battery.

8. The method according to claim 7 including the step of occluding access to a power on-off button with the frame.

9. An enclosure for a tablet computer having plural user-activated control surfaces and a touch-sensitive display screen, said enclosure comprising:
   a frame adapted for receiving the tablet computer and defining a central opening through which a select portion of the display screen is exposed and wherein said frame occludes selected user-activated control surfaces including selected portions of the touch-sensitive display screen so that a user cannot activate said occluded control surfaces;
   a stand for supporting the frame at a desired orientation;
   first electrical contacts on said stand positioned to make electrical contact with second electrical contacts on said frame when the frame is supported on said stand;
   a magnet on the stand and a magnet on the frame located to mate with the magnet on the stand when the frame is supported on said stand, wherein the first and second electrical contacts are brought into alignment and electrical contact when the magnets mate.

10. The enclosure according to claim 9 in which one of the occluded user-activated control surfaces is a power on-off button for said tablet computer.

11. The enclosure according to claim 10 in which the touch-sensitive display screen includes on-screen menu buttons and one of the occluded user-activated control surfaces is a selected portion of the touch-sensitive display screen that includes at least some of the on-screen menu buttons.

12. The enclosure according to claim 10 including an opening in the frame operatively position such that a tool may be inserted into the opening to activate the power on-off button, and said opening sized to prevent activation of the power on-off button with a finger.

\* \* \* \* \*